(12) United States Patent
Imai et al.

(10) Patent No.: US 7,055,936 B2
(45) Date of Patent: Jun. 6, 2006

(54) STRUCTURE AND METHOD FOR CONNECTING FLEXIBLE PRINTED CIRCUIT BOARD TO INKJET PRINT HEAD

(75) Inventors: Koji Imai, Inuyama (JP); Shuhei Hiwada, Toyoake (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 81 days.

(21) Appl. No.: 10/672,740

(22) Filed: Sep. 26, 2003

(65) Prior Publication Data

US 2004/0060969 A1  Apr. 1, 2004

(30) Foreign Application Priority Data

Sep. 27, 2002  (JP) ............................ P2002-283924

(51) Int. Cl.
*B41J 2/05*  (2006.01)
(52) U.S. Cl. ........................................... 347/58
(58) Field of Classification Search ................. 347/50, 347/58
See application file for complete search history.

(56) References Cited

U.S. PATENT DOCUMENTS

| 4,878,070 A | * | 10/1989 | Watrobski | ............... 347/58 |
| 4,922,269 A | * | 5/1990 | Ikeda et al. | ............... 347/50 |
| 6,142,609 A | | 11/2000 | Aoki | |
| 6,322,200 B1 | * | 11/2001 | Feinn et al. | ............... 347/58 |
| 6,328,423 B1 | * | 12/2001 | Wong et al. | ............... 347/50 |

FOREIGN PATENT DOCUMENTS

| JP | 2-17336 | 2/1990 |
| JP | 7-50498 | 2/1995 |
| JP | 9-46031 | 2/1997 |

* cited by examiner

*Primary Examiner*—An H. Do
(74) *Attorney, Agent, or Firm*—Reed Smith LLP

(57) ABSTRACT

A plurality of lands and a plurality of conducting wires connected independently to each land are formed on one side surface of an insulating substrate of a flexible printed circuit board. Through-holes are formed through the insulating substrate for exposing the lands to the other side surface. Solder is provided in the through-holes. The solder connects the lands to the head terminals on an inkjet head, which is located facing the other side surface of the insulating substrate. The insulating substrate separates the solder from areas between the conducting wires and from areas between the lands, thereby preventing short circuits from occurring when manufacturing the connecting structure with a low tolerance grade.

22 Claims, 16 Drawing Sheets

FIG.1
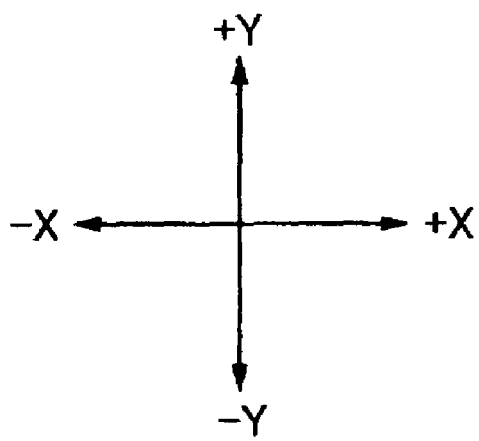
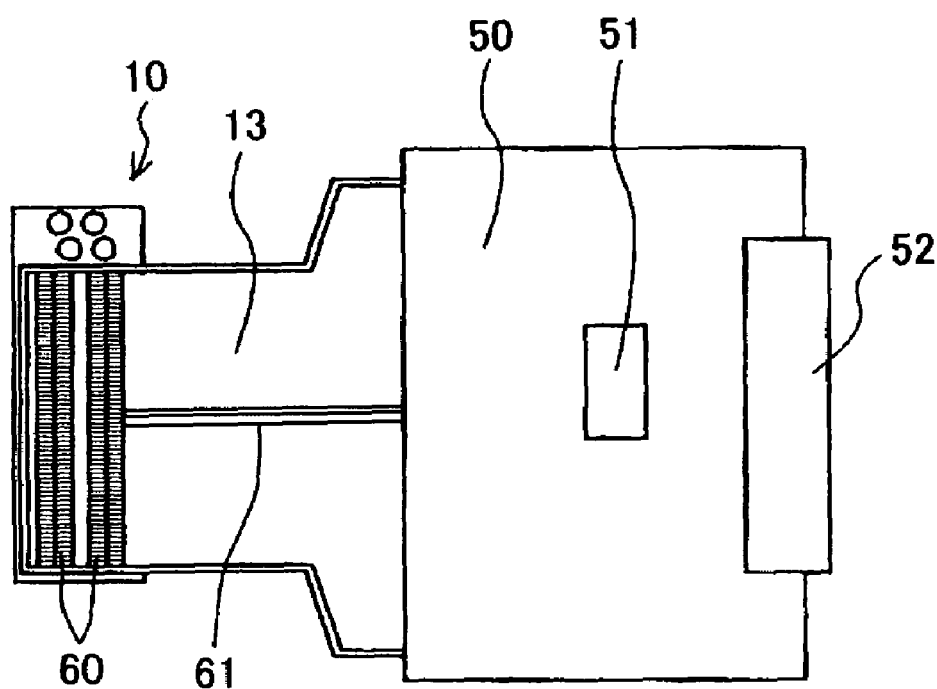

FIG.2
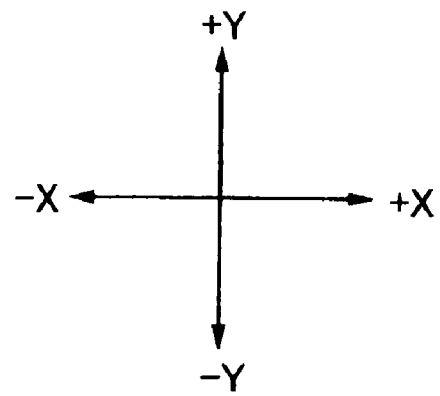
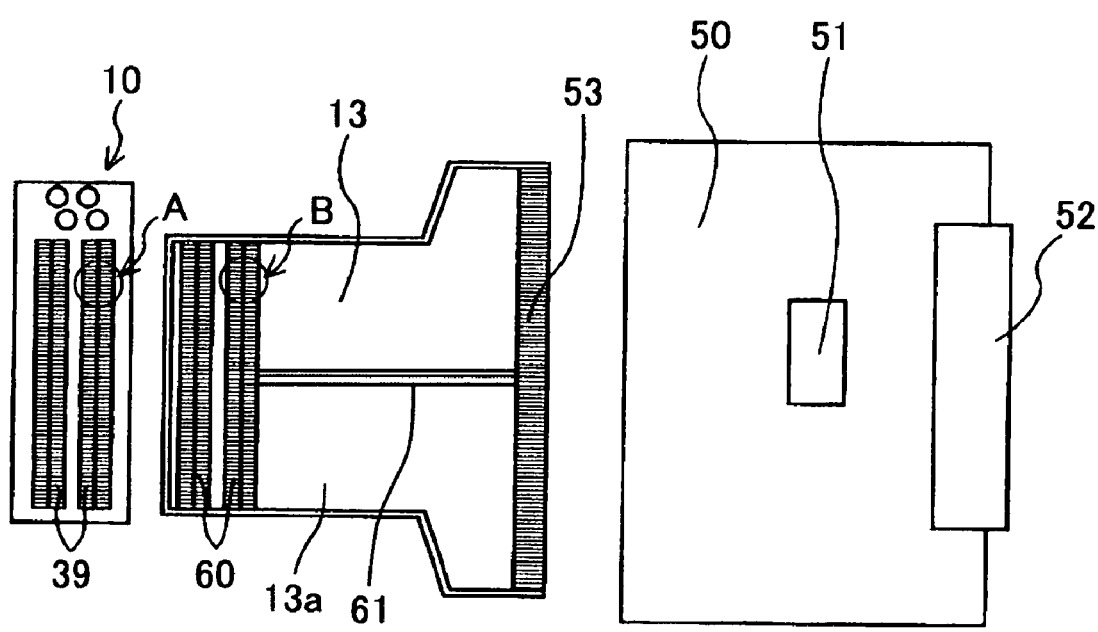

FIG.13A
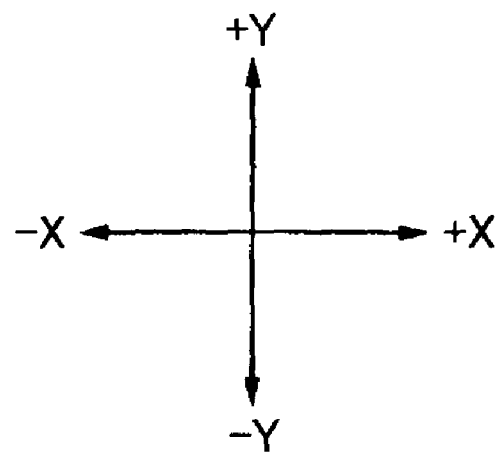
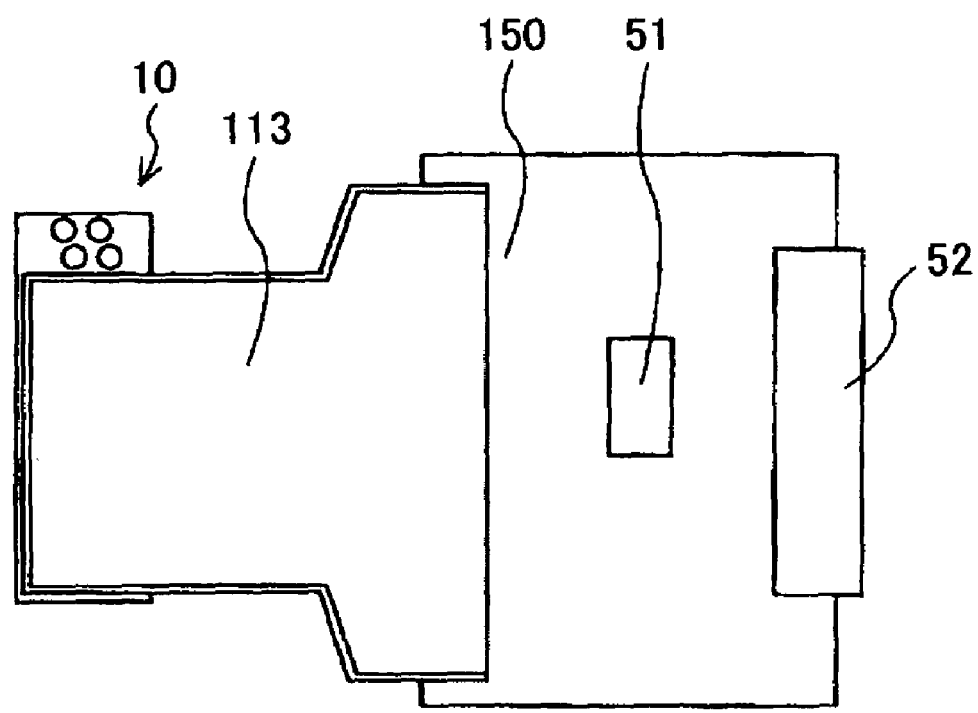

FIG.13B
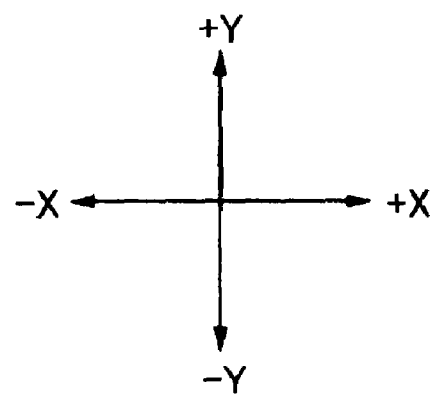
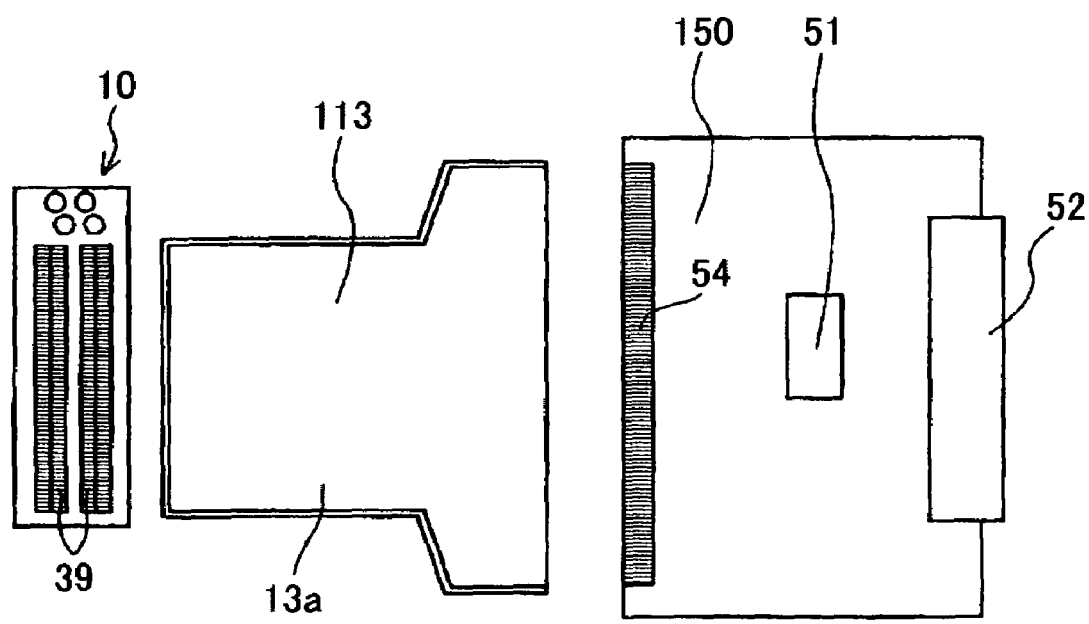

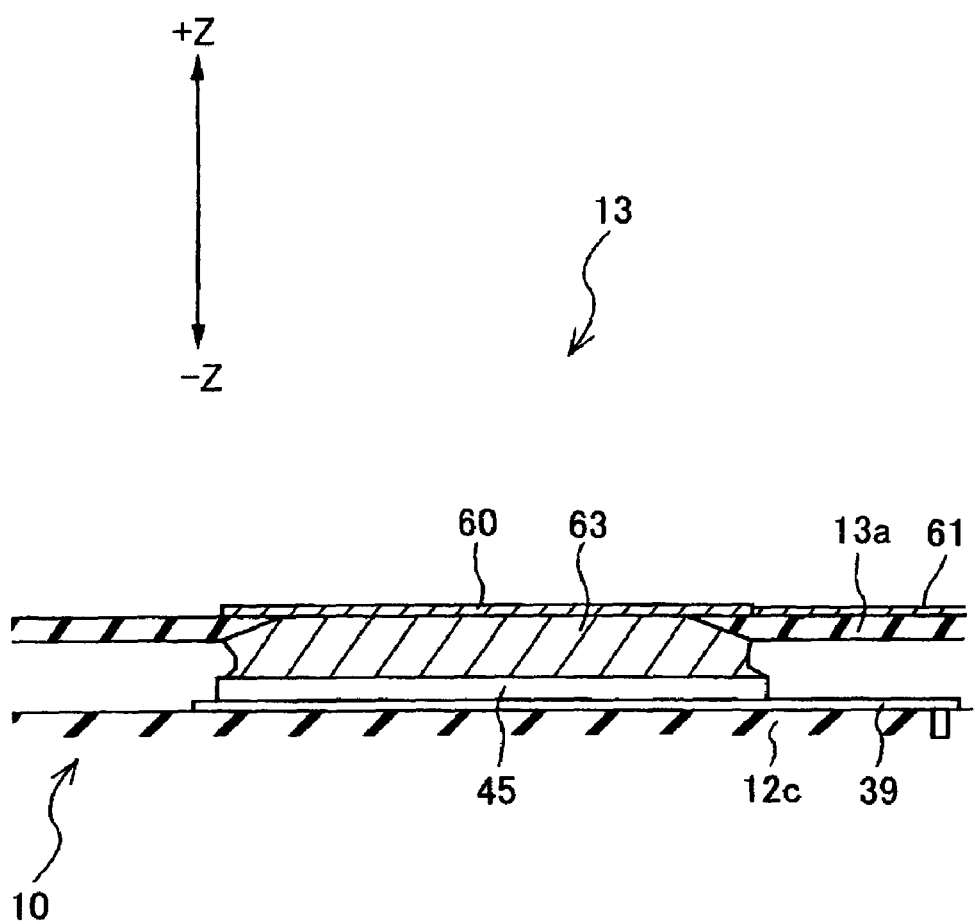

STRUCTURE AND METHOD FOR CONNECTING FLEXIBLE PRINTED CIRCUIT BOARD TO INKJET PRINT HEAD

BACKGROUND OF THE INVENTION

1. Field of the Invention

The present invention relates to a structure and method for connecting a flexible printed circuit board to an inkjet print head in an inkjet recording device.

2. Description of Related Art

Conventional inkjet recording devices perform color printing using four ink cartridges for colors of cyan, magenta, yellow, and black, for example. A holder for accommodating and holding these ink cartridges is provided with: four inkjet heads for ejecting each color of ink, and circuit boards for driving these inkjet heads. These inkjet heads and circuit boards are connected via flexible circuit boards to form a print head unit. Ink is supplied from the ink cartridges to the inkjet heads, and images are recorded by ejecting ink through ejection nozzles.

As the density of these ejection nozzles has increased along with improvements in recording quality of recent years, the terminals of these inkjet heads and the lands of the flexible printed circuit board connected to these terminals have also increase their density. When the terminals are joined to the lands using solder, Japanese patent publication No. 7-50498 discloses that the lands are staggered in order to ensure sufficient separation between individual lands on this limited surface area so that solder bridges are not formed between adjacent solder connections. As disclosed in U.S. Pat. No. 6,142,609, a thin layer of solder is formed on each land and the lands are bonded with terminals by heating the solder while the terminals are positioned over the lands.

SUMMARY OF THE INVENTION

However, in order to arrange the ejection nozzles with more density, the lands on the flexible printed circuit board must be arranged with higher density. To achieve this, the lands should be formed and spaced with more accuracy. The solder should be formed on the lands with more accurate shape and thickness. Further, the terminals should be positioned accurately over the lands. Therefore, the potential for a short-circuit occurring by solder bridge between adjacent lands is high, resulting in a poor production yield. By staggering the lands for a denser arrangement and forming conducting wires between the lands for connecting to the lands, the distance between the conducting members becomes small, which requires higher precision and increases production costs.

In view of the foregoing, an object of the present invention is to provide a method of connecting a flexible printed circuit board, on which lands are arranged at high density, to an inkjet head, on which head terminals are arranged at a high density, while preventing an occurrence of a short circuit. Another object is to provide a connecting structure of the flexible printed circuit board and the ink jet head.

In order to attain the above and other objects, the present invention, provides a method of connecting a plurality of lands provided on a flexible printed circuit board to a plurality of head terminals provided on an inkjet head, the method comprising: preparing a flexible printed circuit board which has an insulating member, a plurality of lands and a plurality of conductive wires being provided on the insulating member, each land being connected to a corresponding conductive wire, the plurality of lands being arranged on the insulating member at locations in one-to-one correspondence with a plurality of head terminals provided on an inkjet head, the insulating member having a plurality of through-holes each for exposing a portion of a corresponding land; placing a conductive brazing material in the through-hole on each land; facing the lands through the through-holes to the head terminals on the inkjet head; and connecting and fixing the lands to the head terminals by melting the conductive brazing material.

According to another aspect, the present invention provides a connecting method of connecting an inkjet head to a flexible printed circuit board, the inkjet head having a plurality of channels arranged in a staggered manner and having a surface on which a plurality of head terminals is formed in a staggered manner in correspondence with the plurality of channels, the flexible printed circuit board having a plurality of conductive lands for supplying control signals from a circuit board to the head terminals, the method comprising: forming, on one surface of a flexible belt-shaped insulating member, a plurality of conductive lands and a plurality of conducting wires, the plurality of conductive lands being formed in a staggered manner at positions corresponding to a plurality of head terminals on an inkjet head, the plurality of conducting wires being individually connected to respective ones of the plurality of lands; forming a plurality of through-holes through the insulating member at positions corresponding to the lands for exposing a portion of each of the plurality of lands on another surface of the insulating member opposite to the one surface of the insulating member; placing a conductive brazing material in the through-hole on each of the lands; facing the lands through the through-hole to the head terminals; and connecting and fixing the lands to the head terminals by melting the brazing material.

According to another aspect, the present invention provides a connecting method of connecting an inkjet head to a flexible printed circuit board, the inkjet head having a plurality of channels arranged in a staggered manner and having a surface on which a plurality of head terminals is formed in a staggered manner in correspondence with the plurality of channels, the flexible printed circuit board having a plurality of conductive lands for supplying control signals from a circuit board to the head terminals, the method comprising: forming, on a surface of a flexible belt-shaped insulating member, a plurality of conductive lands and a plurality of conducting wires, the plurality of conductive lands being formed in a staggered manner at positions corresponding to a plurality of head terminals on an inkjet head, the plurality of conducting wires being individually connected to respective ones of the plurality of lands; covering the plurality of lands and the plurality of conductive wires on the surface of the insulating member with an insulating film, the insulating film having a plurality of through-holes for exposing a portion of each of the plurality of lands; placing a conductive brazing material in each of the through-boles; facing the lands through the through-hole to the head terminals; and connecting and fixing the lands to the head terminals by melting the brazing material.

According to another aspect, the present invention provides a printed circuit board for being connected with an inkjet head having a surface on which a plurality of head terminals are arranged, the printed circuit board comprising: an insulating member; and a plurality of lands and a plurality of conductive wires provided on the insulating member, each land being connected to a corresponding conductive wire, the plurality of lands being arranged on the insulating member at locations in one-to-one correspondence with a plurality of head terminals provided on an inkjet head, the insulating member being formed with a plurality of through-holes each for exposing a portion of a corresponding land, the lands facing through the through-holes to the head terminals on the inkjet head, the through-hole on each land receiving a conductive brazing material placed therein, the conductive brazing material being melted to connect and fix each land to the corresponding head terminal.

According to another aspect, the present invention provides a connecting structure of a flexible printed circuit board for connecting an inkjet head to a circuit board, the inkjet head having a plurality of channels and a surface on which a plurality of head terminals is provided in correspondence with the plurality of channels, the circuit board generating control signals for applying drive voltages to the head terminals, thereby causing the channels to eject ink, the connecting structure comprising: a flexible belt-shaped insulating member having one surface and another surface opposite to each other, the one surface confronting a surface of an inkjet head on which a plurality of head terminals is provided; a plurality of lands made of a conductive material and formed on the another surface of the insulating member at positions corresponding to the plurality of head terminals on the inkjet head, a plurality of through-holes being formed through the insulating member at positions corresponding to the lands for exposing a portion of each of the plurality of lands on the one surface of the insulating member; a plurality of conducting wires formed on the another surface of the insulating member and individually connected to respective ones of the plurality of lands, the conductive wires supplying control signals from a circuit board to the lands; and a conductive brazing material provided in each of the through-holes and electrically connecting the corresponding one of the lands to the corresponding head terminal.

According to another aspect, the present invention provides a connecting structure of a flexible printed circuit board for connecting an inkjet head to a circuit board, the inkjet head having a plurality of channels and a surface on which a plurality of head terminals is provided in correspondence with the plurality of channels, the circuit board generating control signals for applying drive voltages to the head terminals, thereby causing the channels to eject ink, the connecting structure comprising: a flexible belt-shaped insulating member having one surface, the one surface confronting a surface of an inkjet head on which a plurality of head terminals is provided; a plurality of lands made of a conductive material and formed on the one surface of the insulating member at positions corresponding to the plurality of head terminals on the inkjet head; a plurality of conducting wires formed on the one surface of the insulating member and individually connected to respective ones of the plurality of lands, the conductive wires supplying control signals from a circuit board to the lands; an insulating film covering the plurality of lands and the plurality of conductive wires on the one surface of the insulating member, the insulating film having a plurality of through-holes for exposing at least a portion of each of the plurality of lands; and a conductive brazing material provided in each of the through-holes and electrically connecting the corresponding one of the lands to the corresponding head terminal.

According to another aspect, the present invention provides an inkjet head unit comprising: an inkjet head having a surface on which a plurality of head terminals are formed; and a flexible printed circuit board connecting the inkjet head to a control circuit board generating a control signal to control the inkjet head, the flexible printed circuit board comprising: a flexible insulating circuit substrate having one surface and another surface opposite to each other, the one surface confronting the surface of the inkjet head provided with the plurality of head terminals; a plurality of lands made of a conductive material and formed on the another surface of the circuit substrate at positions corresponding to the plurality of head terminals on the inkjet head, a plurality of through-holes being formed through the circuit substrate at positions corresponding to the plurality of the lands, each of the plurality of through-holes exposing a part of the corresponding one of the plurality of lands on the one surface of the circuit substrate; and a plurality of conductive wires formed on the another surface of the circuit substrate, each of the plurality of conductive wires electrically connecting one of the plurality of lands to the circuit board, the conductive wires supplying the control signals from the control circuit board to the lands; wherein the plurality of the lands is connected and fixed individually to respective ones of the plurality of head terminals by a conductive brazing material placed in the corresponding one of the plurality of through-holes.

According to another aspect, the present invention provides an inkjet head unit comprising: an inkjet head having a surface on which a plurality of head terminals are formed; and a flexible printed circuit board connecting the inkjet head to a control circuit board generating a control signal to control the inkjet head, the flexible printed circuit board comprising: a flexible insulating circuit substrate having a surface confronting a surface of the inkjet head on which a plurality of head terminals is provided; a plurality of lands made of a conductive material and formed on the one surface of the circuit substrate at positions corresponding to the plurality of head terminals on the inkjet head; a plurality of conductive wires formed on the one surface of the circuit substrate, each of the plurality of conductive wires electrically connecting one of the plurality of lands to the circuit board, the conductive wires supplying the control signals from the control circuit board to the lands; and an electrically insulating film covering the plurality of lands and the plurality of conductive wires on the one surface of the circuit substrate, the electrically insulating film having a plurality of through-holes exposing a part of each of the plurality of lands; wherein the plurality of the lands are connected and fixed individually to respective ones of the plurality of head terminals on the inkjet head by a conductive brazing material placed in the corresponding one of the plurality of through-holes.

According to another aspect, the present invention provides a printed circuit board for connecting an inkjet head to a control unit, the inkjet head having a surface provided with a plurality of head terminals thereon, the control unit generating signals to control the inkjet head, the printed circuit board comprising: a flexible insulating substrate having a first surface and a second surface opposite to each other, the first surface confronting a surface of an inkjet head provided with a plurality of head terminals; a plurality of conductive lands formed on the second surface of the insulating substrate at positions corresponding to the plurality of head terminals on the inkjet head, a plurality of through-holes being formed through the insulating substrate at positions corresponding to the lands for exposing a portion of each of the plurality of lands on the first surface of the insulating substrate, the plurality of through-holes receiving a brazing material therein; and a plurality of conducting paths formed on the second surface of the insulating substrate and individually connected to respective ones of the plurality of lands, the conductive paths transferring controlling signals from the control unit to the lands.

According to another aspect, the present invention provides a printed circuit board for connecting an inkjet head to a control unit, the inkjet head having a surface provided with a plurality of head terminals thereon, the control unit generating signals to control the inkjet head, the printed circuit board comprising: a flexible insulating substrate having a surface confronting a surface of the inkjet head provided with a plurality of head terminals; a plurality of conductive lands formed on the surface of the insulating substrate at positions corresponding to the plurality of head terminals on the inkjet head; and a plurality of conducting paths formed on the surface of the insulating substrate and individually connected to respective ones of the plurality of lands, the conductive paths transferring signals from a control unit to the lands; and an insulating film covering the plurality of lands and the plurality of conductive wires on the surface of the insulating substrate, the insulating film having a plurality of through-holes for exposing a part of each of the plurality of lands, the plurality of through-holes receiving a conductive brazing material therein.

BRIEF DESCRIPTION OF THE DRAWINGS

The above and other objects, features and advantages of the invention will become more apparent from reading the following description of the preferred embodiments taken in connection with the accompanying drawings in which:

FIG. 1 is a plan view showing a state where an inkjet head and a flexible printed circuit board, and a driver circuit board according to a preferred embodiment are connected together;

FIG. 2 is a plan view showing the inkjet head, flexible printed circuit board, and the driver circuit board in a separation state;

FIGS. 7A–10 show enlarged cross-sections of one of the lands on the flexible printed circuit board and show the steps of connecting the land to the head terminal on the inkjet head:

wherein FIG. 7A shows a wiring process, FIG. 8 shows a solder placing process; FIG. 9 shows a reflow process; and FIG. 10 shows a connecting process;

FIG. 13A is a plan view showing an inkjet head, a flexible printed circuit board, and a driver circuit board according to a second embodiment of the present invention in a connected state;

FIG. 13B is a plan view showing the inkjet head, the flexible printed circuit board, and the driver circuit board of the second embodiment in a separate state;

wherein FIG. 14 shows a wiring process and a coating process; FIG. 15 shows a solder placing process; FIG. 16 shows a reflow process; and FIG. 17 shows a connecting process; and FIG. 18 is an enlarged cross-sectional view showing the connection between the land on the flexible printed circuit board and the head terminal on the inkjet head connected according to a modification.

DETAILED DESCRIPTION OF THE PREFERRED EMBODIMENTS

A connecting structure and a method for connecting a flexible printed circuit board to an inkjet recording head according to preferred embodiments of the present invention will be described while referring to the accompanying drawings.

First Embodiment

First, an inkjet head 10, a flexible printed circuit board 13, and a driver circuit board 50 according to a first embodiment of the present invention will be described with reference to FIGS. 1–12.

Figure 3:
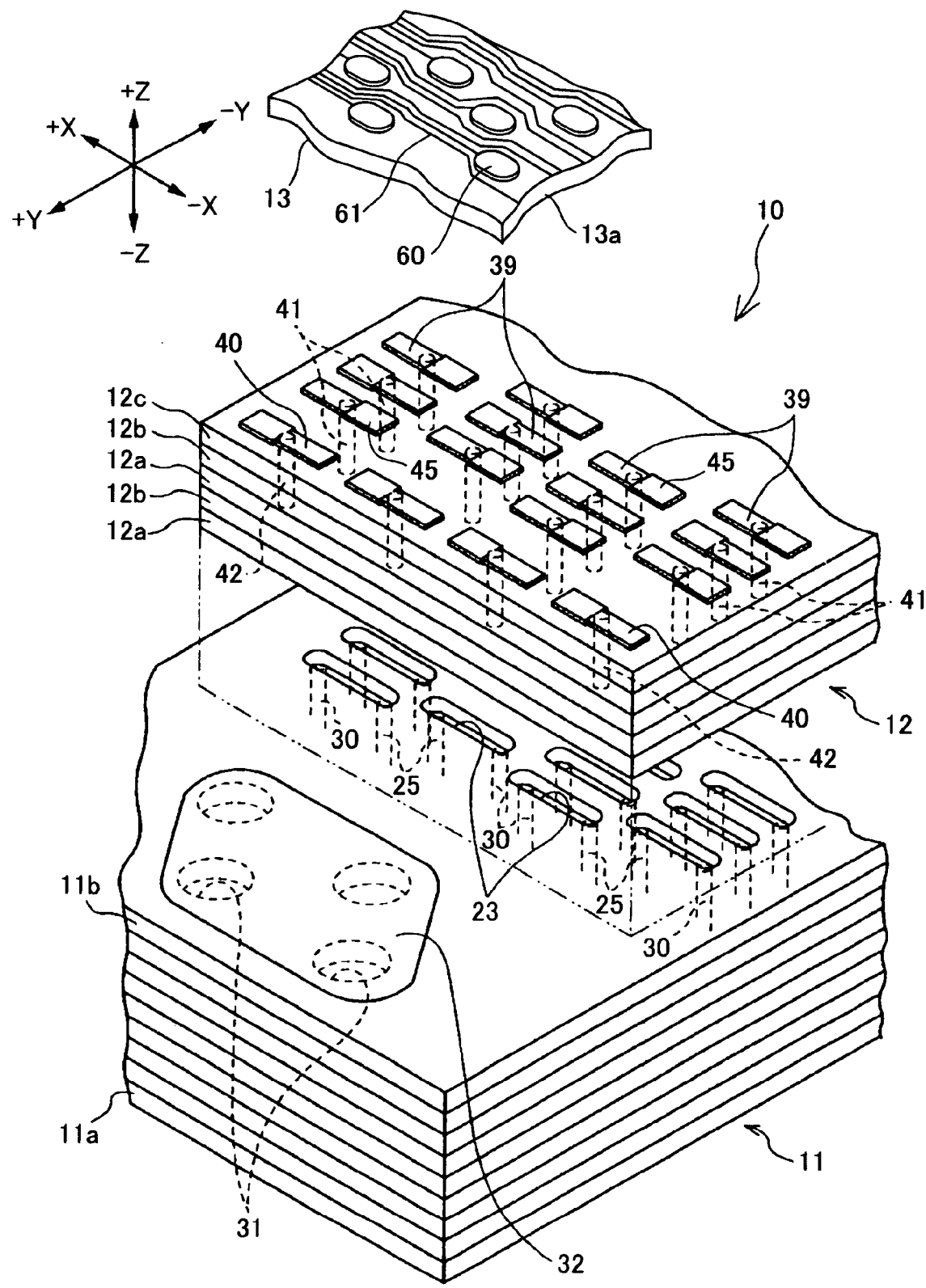
FIG. 3 is an enlarged perspective view showing a portion of the inkjet head and a portion of the flexible printed circuit board.
Figure 4:
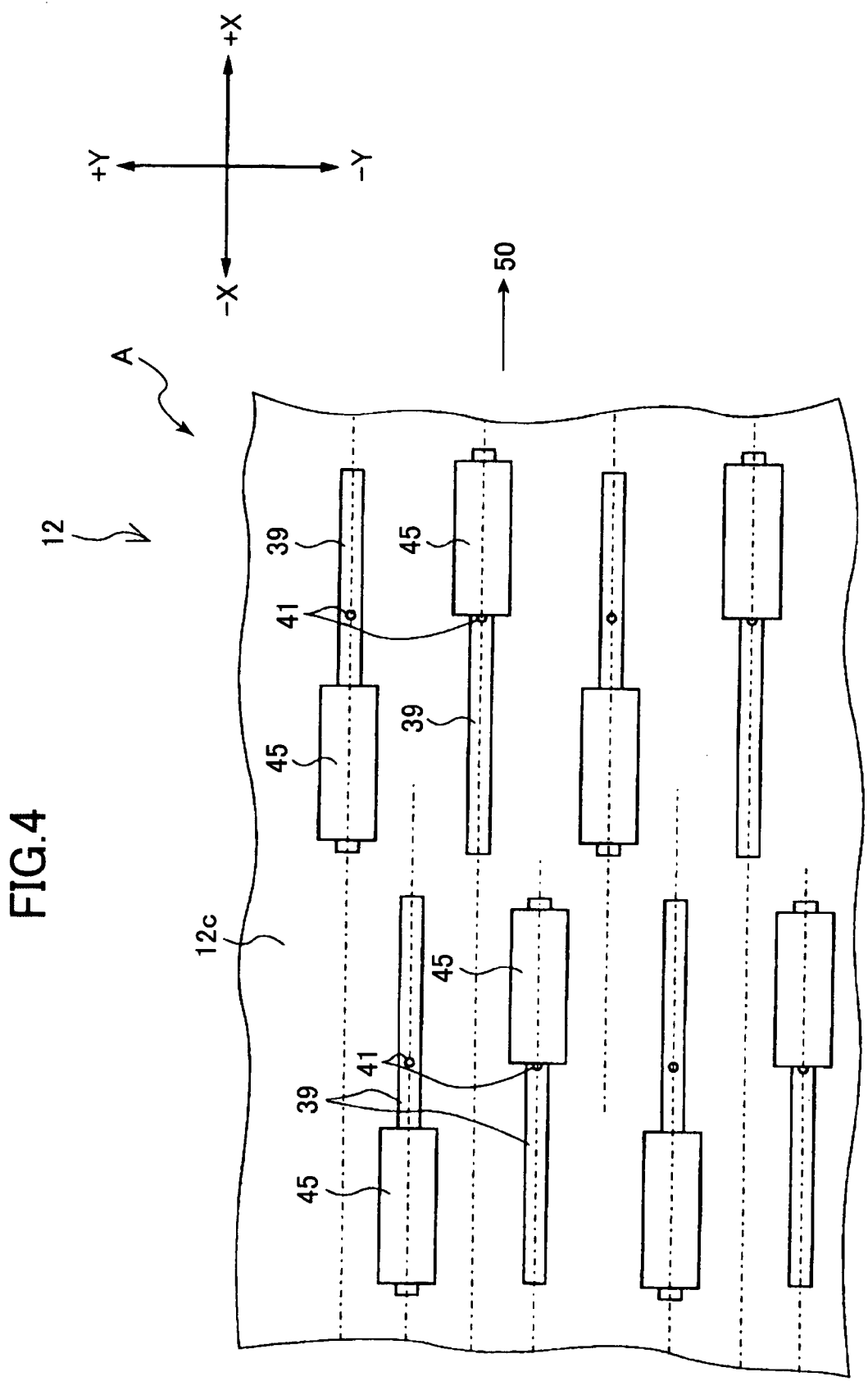
FIG. 4 is an enlarged plan view showing surface electrodes and head terminals on a piezoelectric sheet on the inkjet head at an area indicated by the arrow A in FIG. 2.
Figure 5:
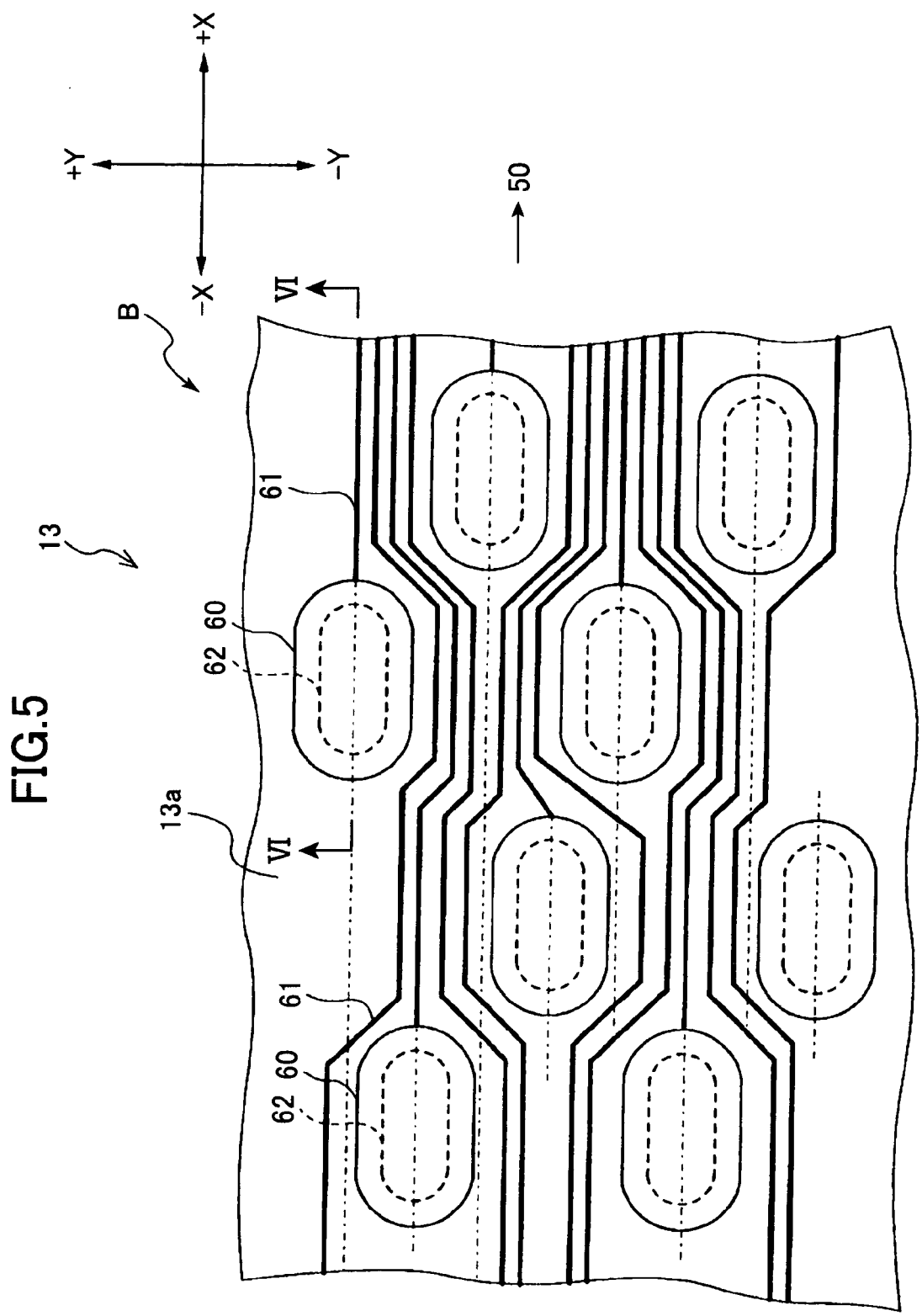
FIG. 5 is an enlarged plan view showing lands on the flexible printed circuit board at an area indicated by the arrow B in FIG. 2.
Figure 6:
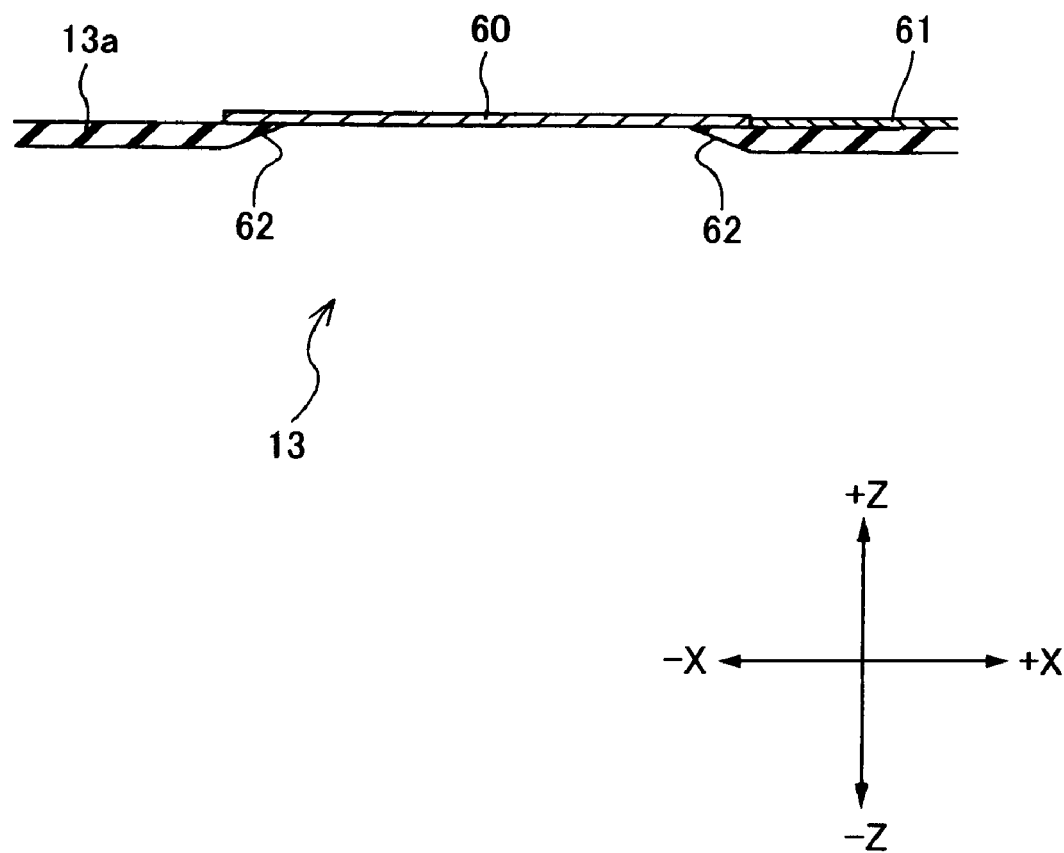
FIG. 6 is an enlarged cross-sectional view of the flexible printed circuit board taken along a line VI—VI in FIG. 5.

FIG. 1 is a plan view showing an inkjet head 10, a flexible printed circuit board 13, and a driver circuit board 50 in a connected state. FIG. 2 is a plan view showing the inkjet head 10, the flexible printed circuit board 13, and the driver circuit board 50, which are not yet connected with one another. FIG. 3 is an enlarged perspective view showing a portion of the inkjet head 10 and a portion of the flexible printed circuit board 13. FIG. 4 is an enlarged plan view showing surface electrodes 39 on the inkjet head 10 in an area indicated by the arrow A in FIG. 2. FIG. 5 is an enlarged plan view showing lands 60 on the flexible printed circuit board 13 in an area indicated by the arrow B in FIG. 2. FIG. 6 is an enlarged cross-sectional view taken along a line VI—VI in FIG. 5. FIG. 6 shows one of the lands 60 on the flexible printed circuit board 13.

As shown in FIG. 1, one end of the belt-shaped flexible printed circuit board 13 is connected to the inkjet head 10, while the other end is connected to the driver circuit board 50. The inkjet head 10, the flexible printed circuit board 13, and the driver circuit board 50 are mounted in an inkjet recording device (not shown). A driver IC 51 is mounted on the driver circuit board 50 for generating control signals to control drive voltages applied to the inkjet head 10.

As shown in FIG. 2, the inkjet head 10 has a substantially rectangular shape from a plan view. One end (–X directional end) of the flexible printed circuit board 13 has a width corresponding approximately to the lengthwise dimension of the inkjet head 10. When the inkjet head 10 and the flexible printed circuit board 13 are in a connected state, the –X directional end of the flexible printed circuit board 13 covers the inkjet head 10, as shown in FIG. 1. The width of the belt-shaped flexible printed circuit board 13 increases from the –X directional end toward the other end (+X directional end). Terminals 53 for connecting the flexible printed circuit board 13 to the driver circuit board 50 are provided on the other end (+X directional end) of the flexible printed circuit board 13 and are arranged along the widthwise direction. The driver circuit board 50 is substantially rectangular in shape. A connector 52 is provided on the edge of the driver circuit board 50 at a side opposite to the side, where the driver circuit board 50 is connected with the terminals 53. The connector 52 is connected to a control circuit (not shown) of the inkjet recording device.

As shown in FIG. 3, the inkjet head 10 includes a cavity unit 11 and a piezoelectric actuator 12. For simplicity, the figure shows the state where the piezoelectric actuator 12 is separate from the cavity unit 11.

The cavity unit 11 includes nine layers of stacked plates, each of which is substantially rectangular in shape. The nine layers of plates are stacked in the ±Z direction. The nine layers of plates include: the bottommost layer 11a made of synthetic resin; the topmost layer 11b made of a metal plate; and seven layers of metal plates sandwiched between the layers 11a and 11b. A plurality of ejection nozzles (not shown) penetrate the plate 11a. The ejection nozzles are formed in four rows, each extending along the lengthwise direction of the plate 11a (+Y and −Y directions in the drawing), the four rows making up two pairs of rows. The ejection nozzles of adjacent rows in each pair are staggered. A plurality of channels 23 corresponding to the ejection nozzles is arranged in a staggered manner along the length of the metal plate 11b, similar to the ejection nozzles. A plurality of through-holes 25 are provided in one to one correspondence with the channels 23 and in one to one correspondence with the ejection nozzles. Each through-hole 25 penetrates the bottom of the corresponding channel 23 and the metal plates stacked between the plates 11a and 11b. The channel 23 is communicated with a corresponding ejection nozzle via the corresponding through-hole 25.

Four manifolds (not shown) are formed in the metal plates stacked between the plate 11a and the plate 11b. The manifolds are formed in one-to-one correspondence with the four rows of the channels 23. Each manifold extends lengthwise in the cavity unit 11. Each manifold is connected to the channels 23 in the corresponding row via ink passages 30. Each ink passage 30 penetrates the bottom of the corresponding channel 23. Each ink passage 30 supplies ink from the corresponding manifold to the corresponding channel 23. Each channel 23 extends widthwise (+X and −X directions in the drawing) in the metal plate 11b at a prescribed distance between the position where the corresponding through-hole 25 is located and the position where the corresponding ink passage 30 is located. Each manifold is also connected to one of four ink supply holes 31 formed in one lengthwise end of the cavity unit 11. Ink is introduced into the manifolds via the ink supply holes 31. A filter 32 covers the ink supply holes 31.

The piezoelectric actuator 12 includes five piezoelectric sheets. The five piezoelectric sheets include: two piezoelectric sheets 12a, 12a; two piezoelectric sheets 12b, 12b; and one topmost piezoelectric sheet 12c. The piezoelectric sheets 12b are stacked alternately with the piezoelectric sheets 12a along the ±Z direction. A plurality of surface electrodes 39 are provided on the top surface of the piezoelectric sheet 12c. As with the channels 23, the surface electrodes 39 are arranged lengthwise on the piezoelectric sheet 12c in four rows including two pairs of rows The surface electrodes 39 are staggered in the adjacent rows of each pair. The surface electrodes 39 are located in one-to-one correspondence with the channels 23. Four surface electrodes 40 are also provided on the top surface of the piezoelectric sheet 12c. Each piezoelectric sheet 12a is provided with a plurality of drive electrodes (not shown), which are located in one-to-one correspondence with the channels 23. A plurality of through-holes 41 is formed through the piezoelectric sheets 12a–12c except for the lowest sheet 12a. Four through-holes 42 are formed through the piezoelectric sheets 12a–12c except for the lowest sheet 12a and for the second lowest sheet 12b. Each piezoelectric sheet 12b is formed with a ground electrode (not shown) across nearly its entire surface, except the areas around the through-holes 41. Each surface electrode 39 is connected to the corresponding drive electrodes on all the piezoelectric sheets 12a via the corresponding through-hole 41. The surface electrode 40 is connected to the ground electrodes on all the piezoelectric sheets 12b via the corresponding through-hole 42.

As shown in FIGS. 2 and 3, the surface electrodes 39 are arranged on the topmost piezoelectric sheet 12c in four rows. The rows extend along the length of the piezoelectric sheet 12c (in the Y direction of FIGS. 2 and 3), as described above, forming two pairs of rows. As shown in FIG. 3, the surface electrodes 39 of two adjacent rows in each of two pairs are arranged in a staggered manner. FIG. 4 shows the surface electrodes 39 in two adjacent rows in one pair that is indicated by an arrow A and that is located nearer to the driver circuit board 50 (FIG. 1) than those in two adjacent rows in the other pair. The right side in FIG. 4 faces toward the driver circuit board 50 of FIG. 1. The surface electrodes 39 are substantially belt-shaped with a size nearly identical to the drive electrodes (not shown) provided on the piezoelectric sheets 12a (FIG. 3). The through-hole 41 is formed through each surface electrode 39 approximately at the center of the surface electrode 39. The surface electrode 39 is connected to the corresponding drive electrode through the through-hole 41. Substantially rectangular head terminals 45 are provided over the respective surface electrodes 39 at positions corresponding to lands 60 on the flexible printed circuit board 13 as shown in FIG. 3. The head terminals 45 are configured wider than the surface electrodes 39 in the ±Y direction and shorter than the surface electrodes 39 in the ±X direction. In each row of the surface electrodes 39 (in the Y direction), the head terminals 45 are alternately provided near opposite ends of the surface electrode 39 in a staggered formation.

As shown in FIGS. 2 and 3, the flexible printed circuit board 13 includes a belt-shaped insulating member (belt-shaped insulating sheet) 13a formed of a flexible insulating film. In this example, the insulting member 13a is formed of polyimide film. Wiring patterns or wiring paths are formed on one surface (+Z side surface) of the insulating member 13a. The wiring patterns include: the lands 60, the conducting wires 61, and the terminals 53 As shown in FIG. 2, the lands 60 are provided on one end of the flexible printed circuit board 13. As shown in FIG. 3, the lands 60 are provided on the +Z side surface of the insulating member 13a at positions in one-to-one correspondence with the head terminals 45.

FIG. 5 shows how the lands 60 are arranged on the +Z side surface of the insulting member 13a in the area indicated by arrow B in FIG. 2 at locations in one-to-one correspondence with the head terminals 45 which are arranged as shown in FIG. 4 in the area indicated by arrow A in FIG. 2. The right side in FIG. 5 faces the driver circuit board 50 of FIG. 1. As shown in FIG. 5, each land 60 is connected to one end of a corresponding individual conducting wire 61. Conducting wires 61 are provided on the +Z side surface of the insulating member 13a to extend between and around other lands 60. In this way, the conducting wires 61 are located between the lands 60. As shown in FIG. 2, the other end of each conducting wire 61 opposite to the end connected to the land 60 is connected to one of the terminals 53 that are arranged widthwise along the other end of the flexible printed circuit board 13 on its +Z-side surface.

Figure 10:
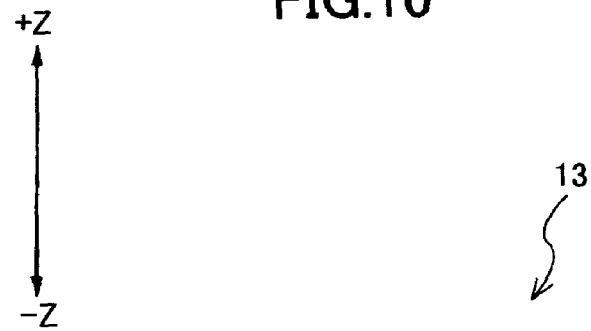

As shown in FIGS. 5 and 6, the lands 60 are formed on the +Z side surface of the insulating member 13a, and through-holes 62 are formed through the insulating member 13a from the −Z side surface to the other surface (+Z side surface). In FIG. 5, the areas surrounded by broken lines indicate the areas of the through-holes 62. The lands 60 are exposed via the through-holes 62 on the −Z side of the flexible printed circuit board 13. The through-holes 62 penetrate the insulating member 13a such that the size of the exposed areas of the land 60 on the −Z side surface is smaller than the area of the land 60 on the +Z side surface as shown in FIG. 6. Further, the surface area of the exposed part of the land 60 on the −Z surface is smaller than the surface area of the head terminal 45 as shown in FIG. 10.

Next, a method of connecting the flexible printed circuit board 13 to the inkjet head 10 will be described with reference to FIGS. 7 through 10. Each of these drawings shows an enlarged cross-section of one land 60 on the flexible printed circuit board 13.

Figure 7A:
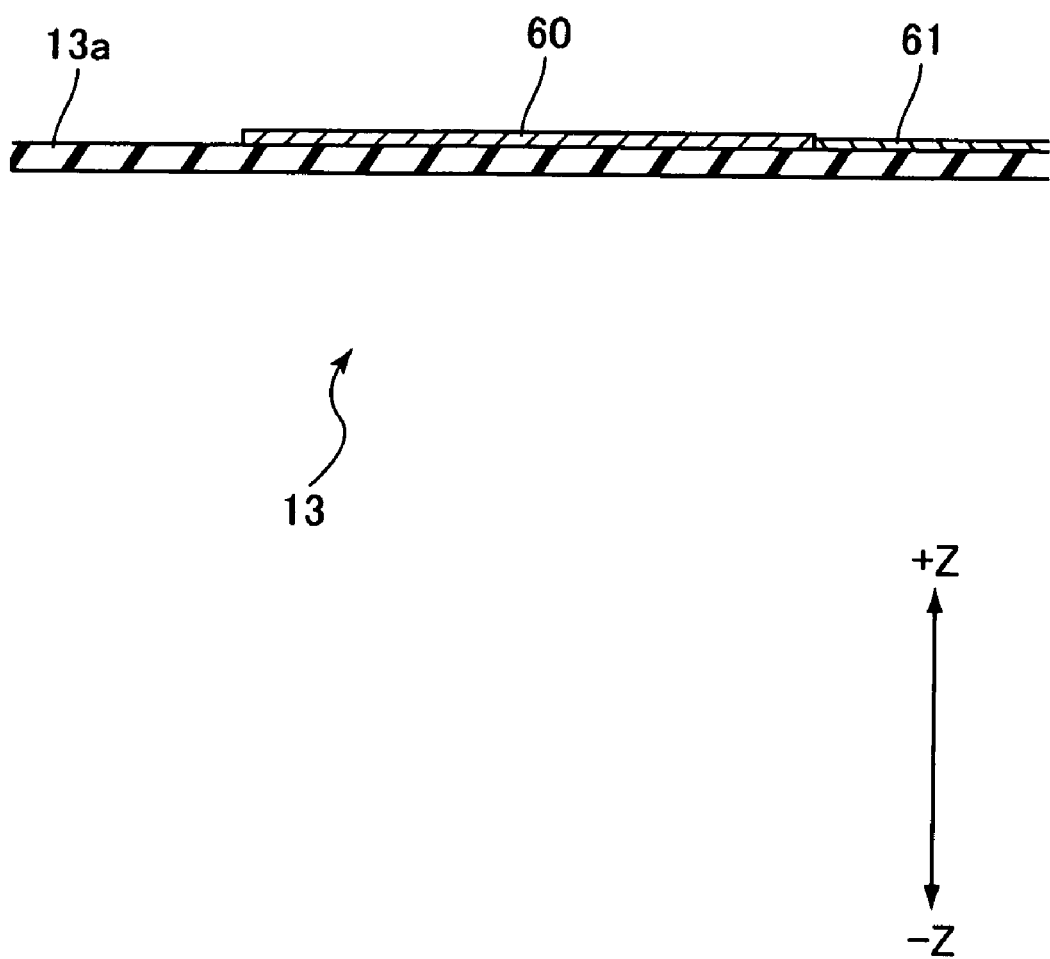

First, as shown in FIG. 7A, a wiring process is executed. More specifically, a copper foil (conductive material) is first formed on one surface (+Z direction side) of the insulating member 13a. An etching process is performed on the copper foil to pattern the copper foil into the wiring pattern. The wiring pattern includes: the plurality of lands 60; the plurality of conducting wires 61; and the plurality of terminals 53.

It is noted that during the wiring process, the insulating member 13a is oriented so that the +Z side surface of the insulating member 13a faces vertically upwardly. However, the insulating member 13a may be oriented with the +Z side surface facing downwardly during the wiring process.

Figure 7B:
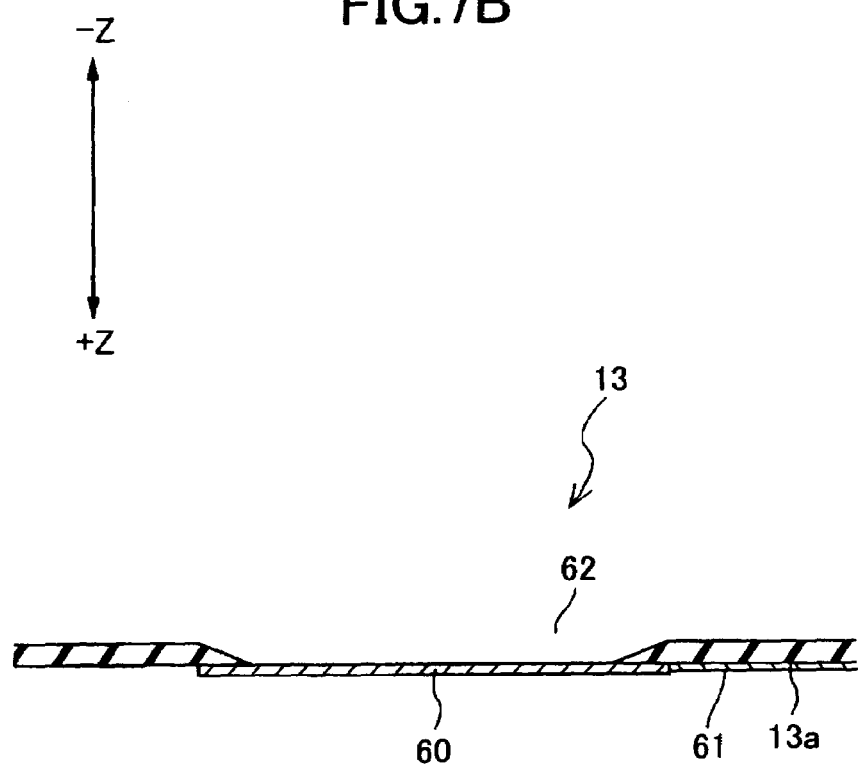
FIG. 7B shows a through-hole forming process.

Next, as shown in FIG. 7B, a through-hole forming process is executed. More specifically, the through-holes 62 are formed through the insulating member 13a to expose the lands 60 on the −Z surface through the insulating member 13a. The through-holes 62 are formed by using processes such as a laser process, a plasma etching process, or an electrolytic etching process well-known in the art. In this way, the flexible printed circuit board 13 having the lands 60, the conducting wires 61, the terminals 53, and the through-holes 62 is produced.

It is noted that during the through-hole forming process, the insulating member 13a is oriented so that the +Z side surface of the insulating member 13a faces vertically downwardly. However, the insulating member 13a may be oriented with the +Z side surface facing upwardly during the through-hole forming process.

Figure 8:
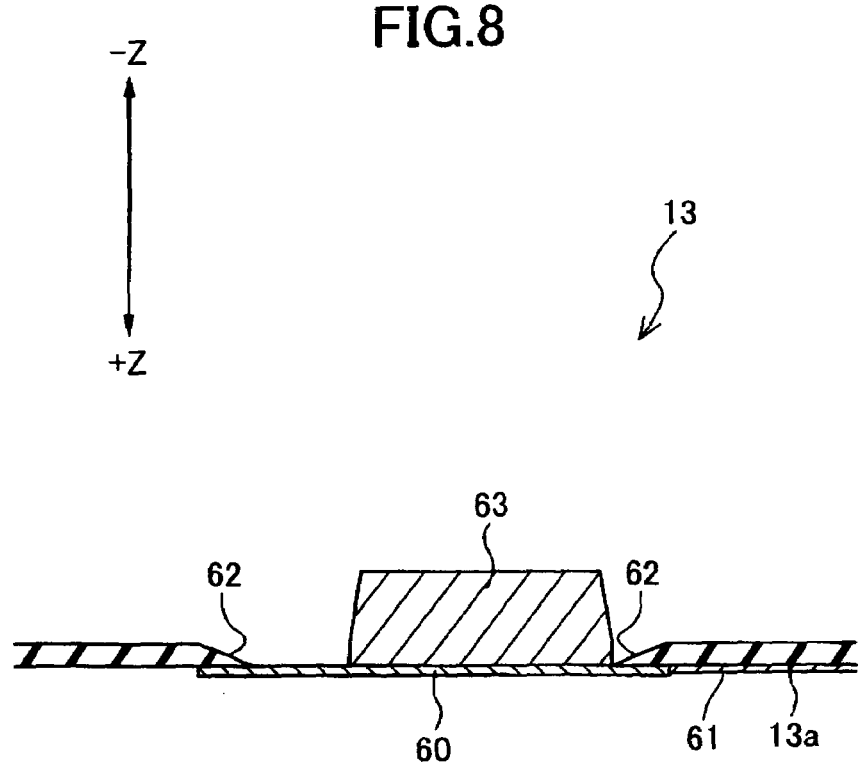

Next, as shown in FIG. 8, a solder placing process is executed. More specifically, the flexible printed circuit board 13 is oriented so that the −Z directional side of the flexible printed circuit board 13 faces vertically upwardly. A conductive brazing material (solder 63, in this example) is printed onto the lands 60 via the through-holes 62 from the −Z direction side (side of the flexible printed circuit board 13 opposite to the +Z direction side where the lands 60 and the conducting wires 61 are provided) using a printing method or another method well known in the art. In this way, the solder 63 is provided on the portions of the lands 60 exposed in the through-holes 62.

Figure 9:
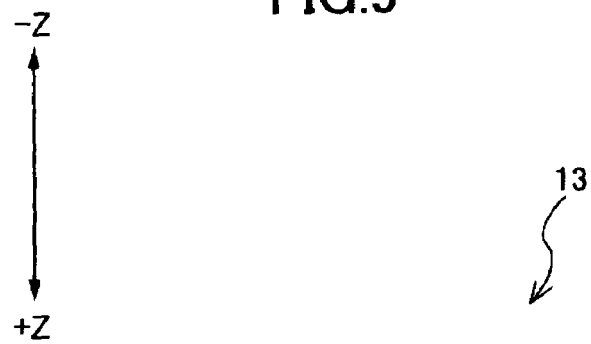

Next, as shown in FIG. 9, a reflow process is executed. More specifically, the entire flexible printed circuit board 13 is exposed to heat by infrared light or laser light after the solder 63 has been provided on the lands 60. The solder 63 begins to melt at a temperature above the melting point of the solder material and spreads along the surface of the lands 60 until covering the entire exposed areas of the lands 60, that is, the areas surrounded by broken lines showing the through-holes 62 in FIG. 5. Thereafter, the lands 60 and solder 63 are cooled until hardened. It is noted that also during the reflow process, the flexible printed circuit board 13 is oriented so that the −Z directional side of the flexible printed circuit board 13 faces vertically upwardly.

Next, as shown in FIG. 10, a connecting process is executed. More specifically, the flexible printed circuit board 13 is positioned over the top surface of the inkjet head 10, that is, the top surface of the piezoelectric sheet 12c. The flexible printed circuit board 13 is oriented so that the −Z direction side of the flexible printed circuit board 13 faces downwardly and confronts the surface of the inkjet head 10 as shown in FIG. 3. The flexible printed circuit board 13 is positioned relative to the inkjet head 10 such that the lands 60 are aligned with the corresponding head terminals 45.

In this way, the flexible printed circuit board 13 is placed upside down over the inkjet head 10, facing the opposite direction than in the solder placing process of FIG. 8 and in the reflow process of FIG. 9. However, since the solder 63 is bonded to the land 60 during the reflow process, the solder 63 does not fall off the flexible printed circuit board 13 when the flexible printed circuit board 13 is turned upside down.

Then, heat is applied to the entire assembly of the inkjet head 10 and the flexible printed circuit board 13 to melt the solder 63. The solder 63 is heated and melted with the flexible printed circuit board 13 stacked on the inkjet head 10, and the solder 63 adapts to the head terminals 45 by spreading over the entire surface of the head terminals 45, thereby bonding the lands 60 to the head terminals 45.

As described above, the surface area of the exposed part of the land 60 is smaller than the surface area of the head terminal 45. Accordingly, when the flexible printed circuit board 13 is placed over the inkjet head 10, the edges of the insulating member 13a defining the through-holes 62 therein prevent the opposing surfaces of the head terminal 45 and the land 60 from contacting with each other. Since the cross-sectional area of the through-holes 62 increases from the +Z side towards the −Z side in the thickness direction of the flexible printed circuit board 13, the head terminal 45 can push out solder 63 within the through-hole 62 when the flexible printed circuit board 13 is stacked over the inkjet head 10. In this case, solder 63 leaking out around the head terminal 45 may flow out onto the surface electrode 39 that is connected to the head terminal 45. This is because solder 63 made of metal is likely to bond with the surface electrode 39 made also from metal. In this way, the surface electrode 39 functions as a is retaining pattern or a retaining portion for preventing the solder 63 from spreading out onto the surface of the piezoelectric sheet 12c to contact neighboring head terminals 45.

Figure 11:
FIG. 11 is an enlarged cross-sectional view showing a state of solder with an allowable minimum amount after the reflow process is completed.
Figure 12:
FIG. 12 is an enlarged cross-sectional view showing a state of solder with an allowable maximum amount after the reflow process is completed.

It is noted that an allowable amount (volume) of solder 63 required for achieving a proper connection between the land 60 and the head terminal 45 is greater than or equal to a predetermined allowable least amount (volume) and smaller than or equal to a predetermined allowable maximum amount (volume). If solder 63 of the least allowable amount is placed on the land 60 during the solder placing process of FIG. 8, the solder 63 produces a column of solder 63 as shown in FIG. 11 when the reflow process of FIG. 9 is completed. This column has a height approximately equivalent to the thickness of the flexible printed circuit board 13 and has a bottom surface area approximately equivalent to the exposed area of the land 60. If solder 63 of the maximum allowable amount is placed on the land 60 during the solder placing process of FIG. 8, the solder 63 completely fills the entire through-hole 62 as shown in FIG. 12 when the reflow process of FIG. 9 is completed. The through-hole 62 has a height equivalent to the thickness of the flexible printed circuit board 13 and has a cross-section that widens in the −Z direction.

If the amount of the solder 63 placed on the land 60 during the solder placing process of FIG. 8 is greater than the allowable maximum amount, the solder 63 will leak around the edge of the head terminal 45 opposing the land 60, forming solder bridges. On the other hand, if the amount of the solder 63 is smaller than the allowable least amount, the solder 63 is unable to fill the gap between the land 60 and the head terminal 45, resulting in poor connections between the land 60 and the head terminal 45.

As described above, according to the present embodiment, the lands 60 are connected to the head terminals 45 by the solder 63 in the through-holes 62 formed through the flexible printed circuit board 13. The flexible printed circuit board 13 isolates the conductive solder 63 from areas between adjacent conductive wirings 61 and from areas between adjacent conductive lands 60. Therefore, this construction prevents short-circuiting between adjacent conductive wires 61 and adjacent lands 60 due to the excess amount of solder 63. Accordingly, the tolerance grade for laying out the head terminals 45 and lands 60 can be reduced even when increasing the density of the lands 60 and the head terminals 45. As a result, it is possible to use a single side flexible printed circuit board, thereby facilitating the production process and reducing production costs.

Second Embodiment

Next, a method and a structure according to a second embodiment of the present invention for connecting the inkjet head 10 to a flexible printed circuit board 113 will be described with reference to FIGS. 13A through 17.

According to the present embodiment, the inkjet head 10 is connected via the flexible printed circuit board 113 of the present embodiment to a driver circuit board 150 of the present embodiment.

Figure 13C:
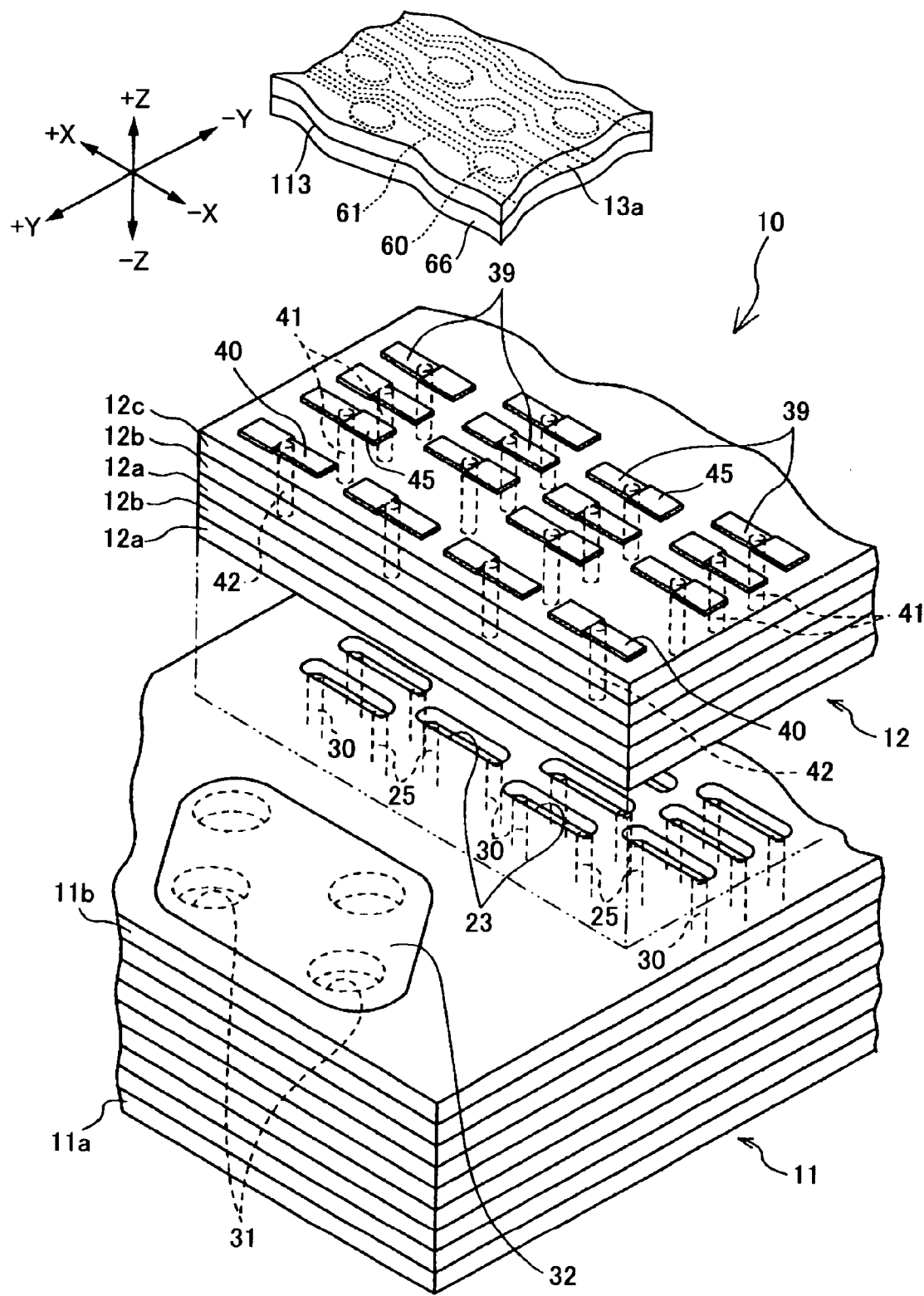
FIG. 13C is an enlarged perspective view showing a portion of the inkjet head and a portion of the flexible printed circuit board of the second embodiment.

FIG. 13A is a plan view showing the inkjet head 10, the flexible printed circuit board 113, and the driver circuit board 150 in their connected state. FIG. 13B is a plan view showing the inkjet head 10, the flexible printed circuit board 113, and the driver circuit board 150 in their separate state. FIG. 13C shows a part of the inkjet head 10 and a part of the flexible printed circuit board 113.

The inkjet head 10 of the present embodiment is the same as that of the first embodiment. The flexible printed circuit board 113 of the present embodiment is different from the flexible printed circuit board 13 of the first embodiment in that the lands 60, the conducting wires 61, and the terminals 53 are formed on the −Z directional surface of the insulating member 13a that faces the inkjet head 10 as shown in FIG. 13C, and in that the resist layer 66 is provided on the −Z surface of the flexible printed circuit board 13 covering the lands 60 and the conductive wires 61. The size and arrangement of the lands 60 and the conducting wires 61 on the flexible printed circuit board 13 are the same as those of the first embodiment. The driver circuit board 150 is different from the driver circuit board 50 of the first embodiment in that the driver circuit board 150 has terminals 54 on its top surface as shown in FIG. 13B. The terminals 54 are connected to the terminals 53 provided on the −Z side surface of the flexible printed circuit board 113. FIGS. 14 through 17 show enlarged cross-sections of the land 60 on the flexible printed circuit board 113 to show how to connect the land 60 to the head terminal 45 according to present embodiment.

Next will be described with reference to FIGS. 14–17 how to connect the flexible printed circuit board 113 to the inkjet head 10 according to the present embodiment.

Figure 14:
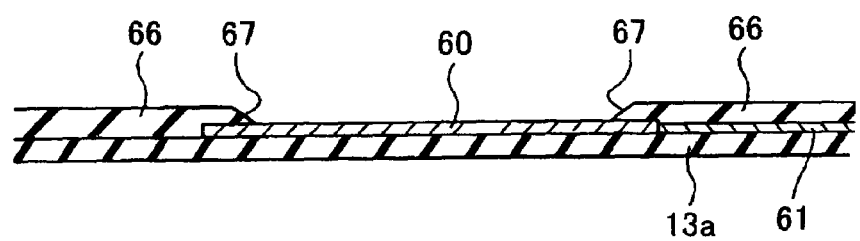
FIGS. 14–17 show enlarged cross-sections of one of the lands on the flexible printed circuit board of the second embodiment, and show the steps of connecting the land to the head terminal on the inkjet head.

First, as shown in FIG. 14, a wiring process and a coating process are executed. More specifically, copper foil is first bonded to the −Z directional surface of the insulating member 13a of the flexible printed circuit board 13. A wiring pattern is formed in the copper foil through an etching process. The wiring pattern includes the lands 60, the conducting wires 61, and the terminals 53. Next, the entire −Z side surface of the insulating member 13a is coated with a thin layer of insulating resist 66 to cover the lands 60 and the conducting wires 61, as shown in FIG. 14. The resist layer 66 is made of an insulating material such as a photoresist or an insulating dry film to prevent the lands 60 and the conducting wires 61 formed on the insulating members 13a from short circuiting. A through-hole 67 is formed through the resist layer 66 at a position corresponding to each land 60 to expose a part of the land 60 on the −Z side surface, as shown in FIG. 14. As with the through-hole 62 in the first embodiment, the surface area of the opening in the through-hole 67 is smaller than the surface area of the land 60.

It is noted that the resist layer 66 does not cover the terminals 53, ensuring that the terminals 53 can be connected with the terminals 54 on the driver circuit board 150.

Figure 15:
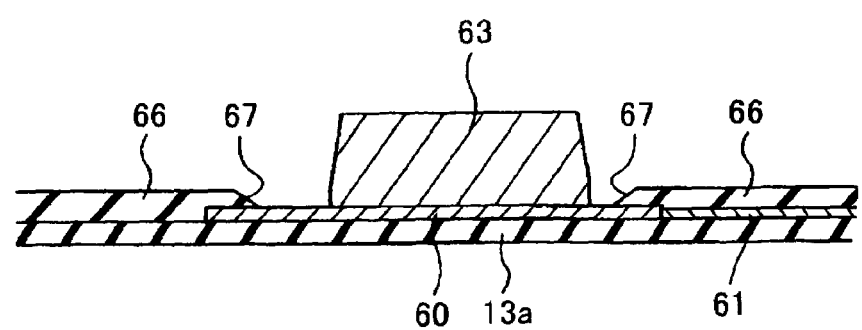

Next, as shown in FIG. 15, a solder placing process is executed. More specifically, the solder 63 is printed at positions corresponding to the lands 60 exposed through the through-holes 67 in the resist layer 66 in the same manner as that of the first embodiment.

Figure 16:
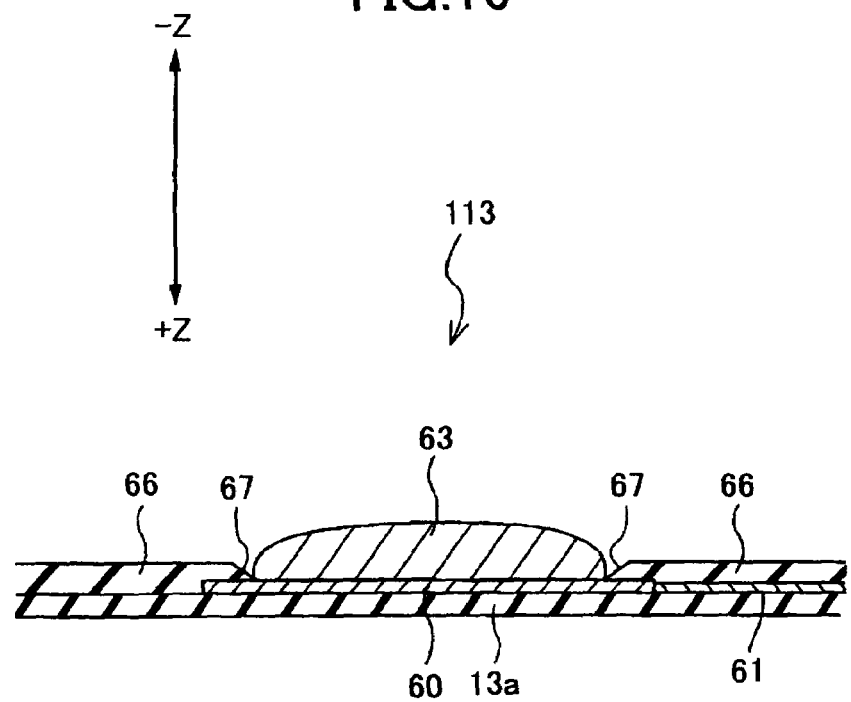

Next, as shown in FIG. 16, a reflow process is executed. More specifically, the entire flexible printed circuit board 13 is heated to melt the solder 63. The solder 63 spreads along the surface of the land 60 to cover the entire exposed area of the land 60. Subsequently, the lands 60 and the solder 63 are cooled to harden the solder 63.

Figure 17:
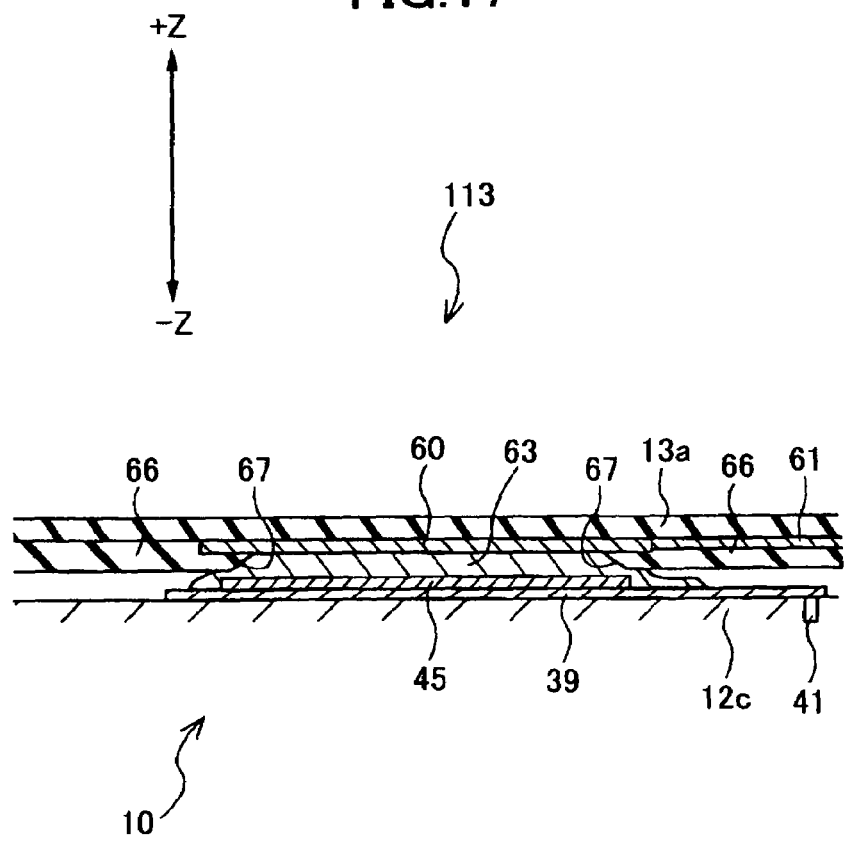

Next, as shown in FIG. 17, a connecting process is executed. More specifically, the flexible printed circuit board 13 is positioned over the inkjet head 10 so that the −Z surface of the flexible printed circuit board 13 confronts the top surface of the inkjet head 10 as shown in FIG. 13C. Each of the lands 60 opposes the surface of the corresponding head terminal 45. The solder 63 is melted by executing a heating process in the same manner as in the connecting process in the first embodiment to bond the land 60 to the head terminal 45.

In the present embodiment, the surface of the circuit board 13 having the lands 60 and conductive wiring 61 thereon is covered with the insulating resist film 66. The lands 60 are connected to the corresponding head terminals 45 with the solder 63 via the through-holes 67 formed in the insulating resist film 66. Since the insulating resist film 66 separates the conductive solder 63 from areas between the conducting wirings 61 and from areas between the conductive lands 60, the construction prevents short-circuiting between adjacent wires 61 and adjacent lands 60 even when an excess amount of the solder 63 is used. Accordingly, the tolerance grade for laying out the head terminals 45 and the lands 60 can be reduced even when increasing the arranging density of the head terminals 45 and the lands 60. As a result, it is possible to use a single side flexible printed circuit board, thereby facilitating the production process and reducing production costs.

Two embodiments are described above for connecting the head terminals 45 on the inkjet head 10 to the lands 60 on the flexible printed circuit boards 13 and 113: the first embodiment for connecting the lands 60 exposed through the through-holes 62 of the insulating member 13a to the head terminals 45 by the solder 63, and the second embodiment for bonding the lands 60 exposed through the through-holes 67 of the resist layer 66 covering the wiring pattern on the flexible printed circuit board 113 to the head terminals 45 by the solder 63.

In the flexible printed circuit board 13 of the first embodiment, the lands 60 in the wiring patterns are formed on one side surface of the insulating member 13a, while the through-holes 62 are formed through the insulating member 13a for exposing the lands 60 to the other side surface of the insulating member 13a. The lands 60 are bonded to the head terminals 45 by the solder 63 through the through-holes 62. Although the conducting wires 61 are arranged on the insulating member 13a at locations between the lands 60, the conducting wires 61 are provided on the surface opposite to the surface bonded with the inkjet head 10. Accordingly, the head terminals 45 need only be positioned on the inkjet is head 10 not to interfere with other head terminals 45. That is, the head terminals 45 need only be spaced to prevent solder from spreading toward the adjacent head terminals 45 to make a solder bridge therewith during the connecting process. Accordingly, short circuits between neighboring lands 60 and short circuits between neighboring head terminals 45 will not occur even if the layout of lands 60 and head terminals 45 is designed and manufactured with a low tolerance in the direction orthogonal to the bonding direction.

In the flexible printed circuit board 113 of the second embodiment, the wiring pattern formed on one side surface of the insulating member 13a is covered by the insulating resist layer 66. The lands 60 are exposed via the through-holes 67 formed through the resist layer 66. The lands 60 are bonded to the corresponding head terminals 45 by the solder 63 in the through-holes 67. Since the resist layer 66 covers the conducting wires 61 formed at locations between the lands 60, short circuits between the conductive wires 61 and the head terminals 45 are avoided. Accordingly, the layout of the lands 60 and head terminals 45 can be designed and produced with a low tolerance.

In each of the above-described embodiments, the flexible printed circuit board 13, 113 can be a single-sided circuit board in which a wiring pattern is formed only on one side.

In the first and second embodiments, the lands 60 are arranged in a staggered manner, enabling a large number of the lands 60 to be arranged densely Further, since the insulating member 13a or the insulating resist film 66 separates the solder 63 from the lands 60 and the conductive wires 61, short circuits between conductive wires 61 and lands 60 are prevented. Accordingly, the connecting strength between the flexible printed circuit board 13, 113 and the inkjet head 10 can be increased when the flexible printed circuit board 13, 113 is fixed to the inkjet head 10 using the solder 63.

Both the lands 60 and the head terminals 45 are arranged in a staggered pattern closely with one another. Accordingly, the flexible printed circuit board 13, 113 and the inkjet head 10 are joined together through the plurality of bonded positions, which are closely distributed in the wide area. Accordingly, external forces acting on the connected assembly of the flexible printed circuit board 13, 113 and the inkjet head 10 can be shared by these many bonded positions, thereby enhancing the bonding strength of the connected assembly.

In the first and second embodiments, the surface electrode 39 is connected to the head terminal 45. Accordingly, solder 63 is retained over the surface electrode 39 when the excess amount of solder 63 is used. Hence this construction can prevent short circuits between neighboring head terminals 45 by excess solder 63.

In the first and second embodiments, the solder 63 placed on the lands 60 in the solder placing process is melted and fixed to the lands 60. By bonding the solder 63 to the lands 60, the solder 63 does not fall off of the lands 60 when the −Z surface having the solder 63 thereon faces vertically downwardly to be connected to the head terminals 45. Further, since the solder 63 spreads over the portions of the lands 60 exposed through the through-holes 62, 67 to cover the entire exposed parts of the lands 60, the bonding strength between the lands 60 and the head terminals 45 can be enhanced. Accordingly, these methods can reduce the occurrence of problems in connections during production, thereby increasing production efficiency.

While the invention has been described in detail with reference to the specific embodiments thereof, it would be apparent to those skilled in the art that various changes and modifications may be made therein without departing from the spirit of the invention.

For example, in the above-described first embodiment, if a large amount of the solder 63 is printed in the solder placing process, when the connecting process is executed with a prescribed gap provided between bonding surfaces of the flexible printed circuit board 13 and the inkjet head 10, then the solder 63 forms a column between the land 60 and the head terminal 45, as shown in FIG. 18, thereby connecting the land 60 and the head terminal 45 together. In this case, protrusions (not shown) can be provided on the piezoelectric sheet 12c when forming the head terminals 45, for example, for preventing the flexible printed circuit board 13 and the inkjet head 10 from over-approaching to each other. This modification can be applied also to the second embodiment.

In the first embodiment, after forming wiring patterns 60, 61, 53 on the +z side surface of the insulating member 13a, the wiring patterns can be further coated with an insulating resist layer to reduce any possibility of short circuiting.

In the first embodiment, it is possible to form the wiring pattern after providing the through-holes 62 through the insulating member 13a so that the positions of the lands 60 correspond to the positions of the through-holes 62.

In the first and second embodiments, the solder 63 is melted by heating the entire assembly during both the reflow process and the connecting process. However, it is possible to heat the solder 63 locally using laser light or by pressing a heat bar on the solder 63.

Instead of performing the solder placing process and the reflow process, the solder 63 can be provided by dipping the flexible printed circuit board 13, 113 in a jet of solder.

In the above-described embodiments, the piezoelectric actuator 12 have five piezoelectric sheets 12a, 12b, 12a, 12b, and 12c. However, the piezoelectric actuator 12 may have more than or less than five piezoelectric sheets.

What is claimed is:

1. A printed circuit board for being connected with an inkjet head having a surface on which a plurality of head terminals are arranged, the printed circuit board comprising:
   an insulating member; and
   a plurality of lands and a plurality of conductive wires provided on the insulating member, each land being connected to a corresponding conductive wire, the plurality of lands being arranged on the insulating member at locations in one-to-one correspondence with the plurality of head terminals provided on the inkjet head, the insulating member being formed with a plurality of through-holes each for exposing a portion of a corresponding land, the lands facing through the through-holes to the head terminals on the inkjet head, the through-hole on each land receiving a conductive brazing material placed therein, the conductive brazing material being melted to connect and fix each land to the corresponding head terminal.

2. The printed circuit board as claimed in claim 1, wherein the plurality of lands are arranged in a staggered manner on the insulating member, and the conductive wires are formed on the insulating member at locations between the lands.

3. The printed circuit board as claimed in claim 1, wherein each head terminal is provided with a portion retaining a portion of the brazing material thereon to prevent the brazing material from contacting another head terminal next to the subject head terminal.

4. The printed circuit board as claimed in claim 3, wherein the retaining portion is made of metal and extends from the corresponding head terminal to retain thereon the portion of the brazing material.

5. The printed circuit board as claimed in claim 1, wherein the insulating member includes a flexible belt-shaped insulating sheet having first and second surfaces opposite to each other,
wherein the plurality of lands and the plurality of conductive wires are provided on the first surface of the flexible belt-shaped insulating sheet, and
wherein each through-hole is formed through the flexible belt-shaped insulating sheet at a location for exposing the portion of the corresponding land on the second surface, the second surface of the flexible belt-shaped insulating sheet facing toward the inkjet head in such a state that the portion of each land exposed through the corresponding through-hole in the flexible belt-shaped insulating sheet confronts the corresponding head terminal on the inkjet head.

6. The printed circuit board as claimed in claim 1, further comprising a flexible belt-shaped insulating sheet having first and second surfaces opposite to each other,
wherein the plurality of lands and the plurality of conductive wires are provided on the second surface of the flexible belt-shaped insulating sheet,
wherein the insulating member includes an insulating film covering the plurality of lands and the plurality of conductive wires on the second surface, each through-hole penetrating through the insulating film at a location exposing the portion of the corresponding land, the insulating film on the second surface of the flexible belt-shaped insulating sheet facing toward the inkjet head in such a state that the portion of each land exposed through the corresponding through-hole in the insulating film confronts the corresponding head terminal on the inkjet head.

7. A connecting structure of a flexible printed circuit board for connecting an inkjet head to a circuit board, the inkjet head having a plurality of channels and a surface on which a plurality of head terminals is provided in correspondence with the plurality of channels, the circuit board generating control signals for applying drive voltages to the head terminals, thereby causing the channels to eject ink, the connecting structure comprising:
a flexible belt-shaped insulating member having one surface and another surface opposite to each other, the one surface confronting the surface of the inkjet head on which the plurality of head terminals is provided;
a plurality of lands made of a conductive material and formed on the another surface of the insulating member at positions corresponding to the plurality of head terminals on the inkjet head, a plurality of through-holes being formed through the insulating member at positions corresponding to the lands for exposing a portion of each of the plurality of lands on the one surface of the insulating member;
a plurality of conducting wires formed on the another surface of the insulating member and individually connected to respective ones of the plurality of lands, the conductive wires supplying control signals from a circuit board to the lands; and
a conductive brazing material provided in each of the through-holes and electrically connecting the corresponding one of the lands to the corresponding head terminal.

8. The connecting structure of a flexible printed circuit board as claimed in claim 7, wherein the plurality of lands are arranged on the another surface of the insulating member in a staggered manner, and the conducting wires are formed on the another surface of the insulating member at locations between the lands.

9. The connecting structure of a flexible printed circuit board as claimed in claim 7, wherein each of the head terminals is provided with a portion retaining the brazing material thereon to prevent the brazing material from contacting another head terminal next to the subject head terminal.

10. The connecting structure as claimed in claim 9, wherein the retaining portion is made of metal and extends from the corresponding head terminal to retain thereon the portion of the brazing material.

11. A connecting structure of a flexible printed circuit board for connecting an inkjet head to a circuit board, the inkjet head having a plurality of channels and a surface on which a plurality of head terminals is provided in correspondence with the plurality of channels, the circuit board generating control signals for applying drive voltages to the head terminals, thereby causing the channels to eject ink, the connecting structure comprising:
a flexible belt-shaped insulating member having one surface, the one surface confronting a surface of an inkjet head on which a plurality of head terminals is provided;
a plurality of lands made of a conductive material and formed on the one surface of the insulating member at positions corresponding to the plurality of head terminals on the inkjet head;
a plurality of conducting wires formed on the one surface of the insulating member and individually connected to respective ones of the plurality of lands, the conductive wires supplying control signals from a circuit board to the lands;
an insulating film covering the plurality of lands and the plurality of conductive wires on the one surface of the insulating member, the insulating film having a plurality of through-holes for exposing at least a portion of each of the plurality of lands; and
a conductive brazing material provided in each of the through-holes and electrically connecting the corresponding one of the lands to the corresponding head terminal.

12. The connecting structure of a flexible printed circuit board as claimed in claim 11, wherein the plurality of lands is arranged on the one surface of the insulating member in a staggered manner, and the conducting wires are formed on the one surface of the insulating member at locations between the lands.

13. The connecting structure of a flexible printed circuit board as claimed in claim 11, wherein each of the head terminals is provided with a portion retaining the brazing material thereon to prevent the brazing material from contacting another head terminal next to the subject head terminal.

14. The connecting structure as claimed in claim 13, wherein the retaining portion is made of metal and extends from the corresponding head terminal to retain thereon the portion of the brazing material.

15. An inkjet head unit comprising:
an inkjet head having a surface on which a plurality of head terminals are formed; and
a flexible printed circuit board connecting the inkjet head to a control circuit board generating a control signal to control the inkjet head, the flexible printed circuit board comprising:
a flexible insulating circuit substrate having one surface and another surface opposite to each other, the one surface confronting the surface of the inkjet head provided with the plurality of head terminals;
a plurality of lands made of a conductive material and formed on the another surface of the circuit substrate at positions corresponding to the plurality of head terminals on the inkjet head, a plurality of through-holes being formed through the circuit substrate at positions corresponding to the plurality of the lands, each of the plurality of through-holes exposing a part of the corresponding one of the plurality of lands on the one surface of the circuit substrate; and
a plurality of conductive wires formed on the another surface of the circuit substrate, each of the plurality of conductive wires electrically connecting one of the plurality of lands to the circuit board, the conductive wires supplying the control signals from the control circuit board to the lands; wherein
the plurality of the lands is connected and fixed individually to respective ones of the plurality of head terminals by a conductive brazing material placed in the corresponding one of the plurality of through-holes.

16. The inkjet head unit as claimed in claim 15, wherein each of the head terminals is provided with a portion retaining the brazing material thereon to prevent the brazing material from contacting another head terminal next to the subject head terminal.

17. The inkjet head unit as claimed in claim 16, wherein the retaining portion is made of metal and extends from the corresponding head terminal to retain thereon the portion of the brazing material.

18. An inkjet head unit comprising:
an inkjet head having a surface on which a plurality of head terminals are formed; and
a flexible printed circuit board connecting the inkjet head to a control circuit board generating a control signal to control the inkjet head, the flexible printed circuit board comprising:
a flexible insulating circuit substrate having a surface confronting a surface of the inkjet head on which a plurality of head terminals is provided;
a plurality of lands made of a conductive material and formed on the one surface of the circuit substrate at positions corresponding to the plurality of head terminals on the inkjet head;
a plurality of conductive wires formed on the one surface of the circuit substrate, each of the plurality of conductive wires electrically connecting one of the plurality of lands to the circuit board, the conductive wires supplying the control signals from the control circuit board to the lands; and
an electrically insulating film covering the plurality of lands and the plurality of conductive wires on the one surface of the circuit substrate, the electrically insulating film having a plurality of through-holes exposing a part of each of the plurality of lands; wherein
the plurality of the lands are connected and fixed individually to respective ones of the plurality of head terminals on the inkjet head by a conductive brazing material placed in the corresponding one of the plurality of through-holes.

19. The inkjet head unit as claimed in claim 18, wherein each of the head terminals is provided with a portion retaining the brazing material thereon to prevent the brazing material from contacting another head terminal next to the subject head terminal.

20. The inkjet head unit as claimed in claim 19, wherein the retaining portion is made of metal and extends from the corresponding head terminal to retain thereon the portion of the brazing material.

21. A printed circuit board for connecting an inkjet head to a control unit, the inkjet head having a surface provided with a plurality of head terminals thereon, the control unit generating signals to control the inkjet head, the printed circuit board comprising:
a flexible insulating substrate having a first surface and a second surface opposite to each other, the first surface confronting the surface of the inkjet head provided with the plurality of head terminals;
a plurality of conductive lands formed on the second surface of the insulating substrate at positions corresponding to the plurality of head terminals on the inkjet head, a plurality of through-holes being formed through the insulating substrate at positions corresponding to the lands for exposing a portion of each of the plurality of lands on the first surface of the insulating substrate, the plurality of through-holes receiving a brazing material therein; and
a plurality of conducting paths formed on the second surface of the insulating substrate and individually connected to respective ones of the plurality of lands, the conductive paths transferring controlling signals from the control unit to the lands.

22. A printed circuit board for connecting an inkjet head to a control unit, the inkjet head having a surface provided with a plurality of head terminals thereon, the control unit generating signals to control the inkjet head, the printed circuit board comprising:
a flexible insulating substrate having a surface confronting a surface of the inkjet head provided with a plurality of head terminals;
a plurality of conductive lands formed on the surface of the insulating substrate at positions corresponding to the plurality of head terminals on the inkjet head; and
a plurality of conducting paths formed on the surface of the insulating substrate and individually connected to respective ones of the plurality of lands, the conductive paths transferring signals from a control unit to the lands; and
an insulating film covering the plurality of lands and the plurality of conductive wires on the surface of the insulating substrate, the insulating film having a plurality of through-holes for exposing a part of each of the plurality of lands, the plurality of through-holes receiving a conductive brazing material therein.

* * * * *